United States Patent [19]
Yamamura et al.

[11] Patent Number: 5,729,316
[45] Date of Patent: Mar. 17, 1998

[54] LIQUID CRYSTAL DISPLAY MODULE

[75] Inventors: Nobuyuki Yamamura; Seok-Tae Kim, both of Kyungki-do, Rep. of Korea

[73] Assignee: Samsung Electronics Co., Ltd., Suwon, Rep. of Korea

[21] Appl. No.: 497,479

[22] Filed: Jul. 3, 1995

[30] Foreign Application Priority Data

Jul. 7, 1994 [KR] Rep. of Korea .................. 94-16226

[51] Int. Cl.[6] ............................................ G02F 1/1345
[52] U.S. Cl. ..................................... 349/150; 349/149
[58] Field of Search ................................ 349/150, 149

[56] References Cited

U.S. PATENT DOCUMENTS

| | | | |
|---|---|---|---|
| 4,431,270 | 2/1984 | Funada et al. | 349/150 |
| 5,193,022 | 3/1993 | Hirai | 349/150 |
| 5,517,344 | 5/1996 | Hu et al. | 349/149 |
| 5,528,403 | 6/1996 | Kawaguchi et al. | 349/149 |

FOREIGN PATENT DOCUMENTS 9115530  4/1993  Rep. of Korea .............. G02F 1/133

OTHER PUBLICATIONS

*Official Gazette*, Aug. 16, 1994, re: U.S. Patent 5,339,181 of Kim et al..

*Primary Examiner*—William L. Sikes
*Assistant Examiner*—Charles Miller
*Attorney, Agent, or Firm*—Cushman Darby & Cushman IP Group of Pillsbury Madison & Sutro LLP

[57] ABSTRACT

Described in this invention is a liquid crystal display module (LCD module) in which a printed circuit board has the step structure therein, while forming an extension, and the partial and entire wires of the gradation voltage or the color signals are arrayed on the extension in one or more layers. This LCD module can be used for semiconductor devices requiring a compact LCD panel of high quality and small size.

3 Claims, 5 Drawing Sheets

5,729,316

LIQUID CRYSTAL DISPLAY MODULE

BACKGROUND OF THE INVENTION

The present invention relates to a liquid crystal display module (LCD module), wherein a printed circuit board has the step structure therein, so that color signal lines have a high density structure, while maintaining an area of LCD uniformly at any case.

DESCRIPTION OF THE PRIOR ART

Display device technology has concentrated on production of screens which minimize size and weight. To meet these requirements, research and development has been actively pursued to develop devices which can replace large Cathode Ray Tubes (CRT). In particular, liquid crystal displays (LCD) have been widely applied in notebook computers and TVs providing large displays in view finders providing small, high density displays as well as in clocks and electronic computers requiring small, light weight displays with low power consumption. To obtain the largest possible effective display area in the display panel and to form the thinnest module, a technique of applying a driver integrated circuit to an LCD panel has been developed.

There are several methods for connecting a driver IC on a circuit board to a TFT panel. One is to connect a PCB mounting a driver IC therein to an LCD panel; another is to directly connect a driver IC to an LCD panel referred to as a chip on glass method (COG). The first method can be further divided into two methods, fabricating an IC on a PCB and on a flexible tape by gang bonding, i.e., tape automated bonding method (TAB). Moreover, forming transistors of pixels on a polycrystalline silicone TFT-LCD panel, while fabricating the driver circuit on that panel at the same time, has been actively developed.

Fabricating an IC on a PCB commonly used for an OA black and white LCD panel comprises: soldering or COB wire-bonding of the driver IC to the PCB, and then connecting the LCD panel to the circuit board through an elastomer connector or an anisotropic conductive film.

Tape automated bonding (TAB) is the most popular method in the field of high pixel element such as liquid crystal TVs, OA color LCD panels, etc. Entire bumps of a driver IC are simultaneously bonded to a tap tape carrier by hot press bonding, the overall surface of a driver IC is sealed by a resin, and then the sealed driver IC is finally connected to the LCD panel by an anisotropic conductive film or a photohardened film. In general, this method has advantages that the examined driver IC can be connected to the LCD panel with high yield and reliability, as well as minimizing the connecting area. However, this method has disadvantages including wiring boards made of polyamide, etc., are costly and require many elements in their construction; the method requires additional equipment to make the many connections between the driver IC and the LCD panel; and it is difficult to connect each terminal having the minute pitch since a restriction is generated in forming the tape carrier pattern and in connecting the electrode of the tap board to the LCD panel.

The chip on glass (COP) method is a useful method for producing a compact panel having a high integrated pixel structure and the thinnest width. This method is completed by forming the electrode of the pixel on the TFT glass of the LCD panel, patterning the LCD panel for mounting the driver IC, and then connecting the LCD panel to the TFT glass. It is noted that the above-mentioned procedures are executed simultaneously. This method can be divided into a wire bonding method, a rubber connecting method, and a bump or conductive material connecting method including a resin sealing step. Many advantages can be expected from this method. Included among these are that the pattern construction having the minute pitch pattern (50 and less) is available by forming the electrode of the pixel on the TFT glass of the LCD panel and at the same time patterning the LCD panel for mounting the driver IC, so that the yield and stability are improved by fabricating the LCD module with the minimum of connecting parts. A further, possibly more significant, advantage is the smallest volume and lowest production cost.

Meanwhile, the pattern of the driver IC is complicated, and the replacement of the disabled driver IC is very difficult because many driver ICs are mounted in one LCD panel. Besides, the yield is lower than that of other prior art using the diffusion between the metal layers.

The present invention uses the TAB method, by which means the production of the LCD panel having large area at a low cost is possible.

FIG. 1A is a plan view of a typical, prior art liquid crystal display module, while FIG. 1B is a partial cross sectional view. As illustrated in FIG. 1A, a TFT color LCD module 10 comprises an LCD panel 13 including a color filter glass 11 and a TFT glass 12, a gate PCB 14, and two source PCB 15.

The above gate PCB 14 generates various control signals required to drive the LCD panel 13 and processes the data; includes a circuit (not illustrated) generating the gradation voltage as well as power source, and a plurality of gate driver IC 16 which turns on/off a horizontal line of the LCD panel 13. In further detail, the input terminal of the gate driver IC 16 is connected to the gate PCB 14, while the output terminal of the ate driver IC 18 is connected to the input line arrayed in the TFT glass 12 of the LCD panel 13. Further, the source PCB 15 is connected to a plurality of the source driver IC 17 in parallel. In FIG. 1A, a reference numeral 18 denotes an input terminal.

FIG. 1B is a partial cross-sectional view of a typical prior art liquid crystal display module. As illustrated in this view, a liquid crystal material fills a gap between the TFT glass 12 and the color filter glass 11, while the circumference is sealed by a sealing material. An anisotropic conductive film 19 is formed on the TFT glass 12 to facilitate the contact with the source driver IC 17, which is formed on the source PCB 15, while the above source driver IC 17 and a tape carrier 20 are soldered, and the panel side of the above tape carrier is heated and compressed by a anisotropic conductive file 19, and connected electrically.

FIG. 2 is a wiring diagram of the typical PCB board. In this view, the source PCB 15 structure includes a signal transmitting wire 21 which transmits color signals R, G, B from the gate PCB (not illustrated) to drive the LCD panel, a gradation voltage wire 22 of which voltage selected by the color data is applied to the LCD module, a color signal terminal 23 which is connected to the signal transmitting wire 21 in parallel, a gradation voltage terminal 24 which is connected to the gradation voltage wire 22 in parallel, a power terminal 25 which supplies power source to each element, a ground terminal 26 which protects the LCD module from a over voltage, and a signal inputting terminal 27. In this structure, each layer is electrically connected by a contact hole.

The source PCB 15 is electrically connected to the control circuit of the gate PCB 14, receives the color data R,G,B from the control circuit of the gate PCB 14 as ell as the gradation voltage and the control signals from the input terminal 18 for controlling the source driver IC 17, transmits the applied data to the source driver IC based on the horizontal control signal, and then outputs the decoded gradation voltage to the vertical data line formed on the TFT glass.

This structure, however, is disadvantageous in that wiring is difficult because it is constructed in the limited area. In general, though the prior PCB having high accumulated layers solves the above-mentioned problems, it has another problem of a high cost.

SUMMARY OF THE INVENTION

In view of the above, it is an object of the present invention to provide an LCD module having a high integrated pixel structure and the thinnest possible volume at a low price by which a PCB, on which a driver IC should be formed, is fabricated so that the stop is formed therein, and the increased signal lines are arrayed on the extended PCB board to the horizontal direction.

To achieve this object, according to a preferred embodiment of the present invention, an LCD module comprises an LCD panel, a driver IC for driving the LCD panel, a PCB for array the driver integrated circuit thereon, wherein the driver IC has an extension having steps on its one side, which is extended to an inert region.

DETAILED DESCRIPTION OF THE PREFERRED EMBODIMENTS

A preferred embodiment of the present invention is described with reference to the accompanying drawings.

Figure 1A:
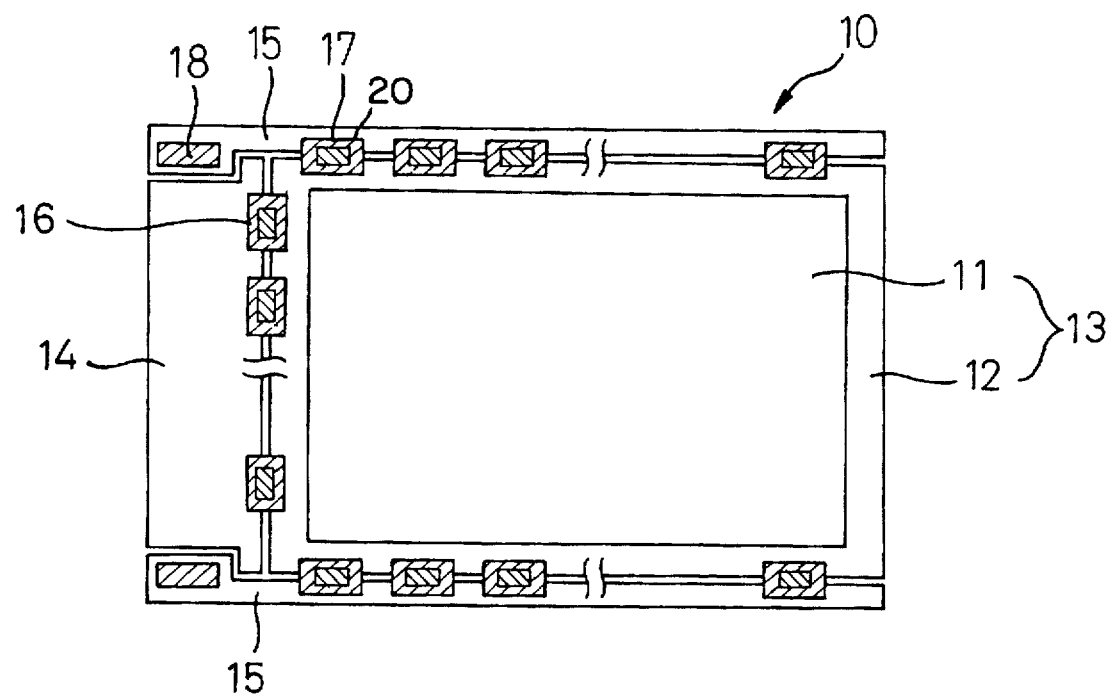
FIG. 1A is a plan view of a typical prior art LCD module.
Figure 1B:
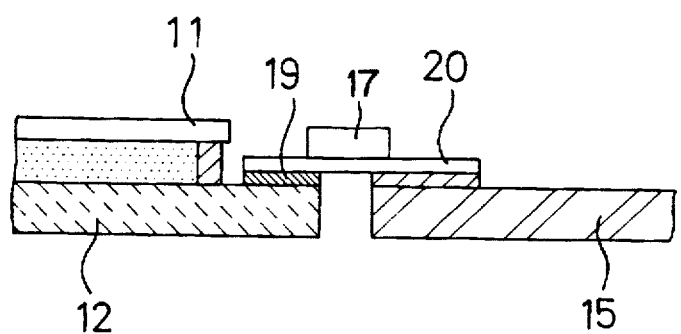
FIG. 1B is a partial cross-sectional side elevation view of a typical, prior art LCD module.
Figure 2:
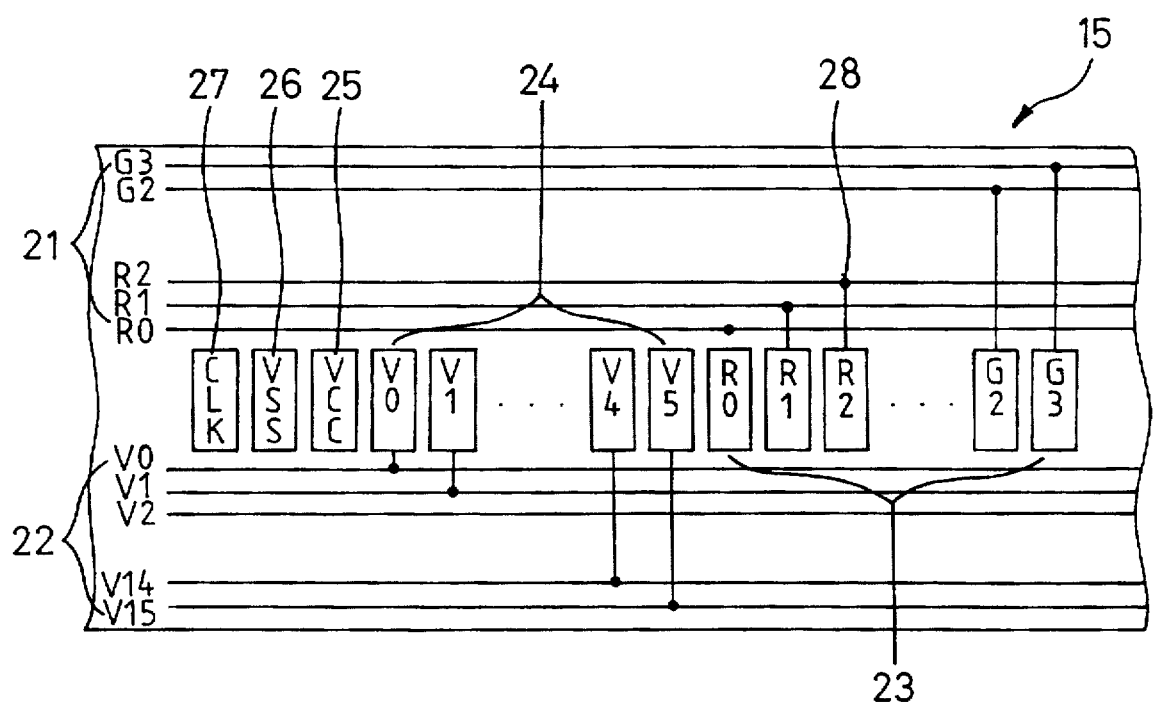
FIG. 2 is a wiring diagram formed on a PCB of a typical PCB.
Figure 3A:
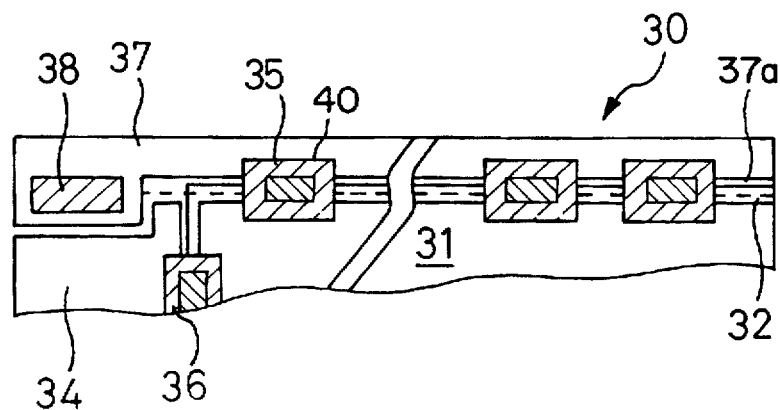
FIG. 3A is a plan view of one embodiment of the invention.

FIG. 3A is a plan view of one embodiment of the invention. In this view, a thin film transistor (TFT) color liquid crystal display (LCD) 30 includes a color filter glass 31, a TFT glass 32, a gate PCB 34 and a source PCB 37. The gate PCB 34 generates the various control signals and processes the data; and includes a circuit (not illustrated) generating the gradation voltage as well as power source, and a plurality of gate driver IC 36 for turning on the horizontal line of the panel. As an extension 37a to a longitudinal direction of a source PCB is possible, this structure permits a circuit to have various patterns.

In the gate driver IC 36, an input pin is connected to the gate PCB 34, while an output pin is connected to an input line on the LCD panel 31 through a tape carrier 40.

The source PCB 37 is electrically connected to a plurality of the source driver IC 35. In this view, a reference numeral 38 denotes an input terminal.

Figure 3B:
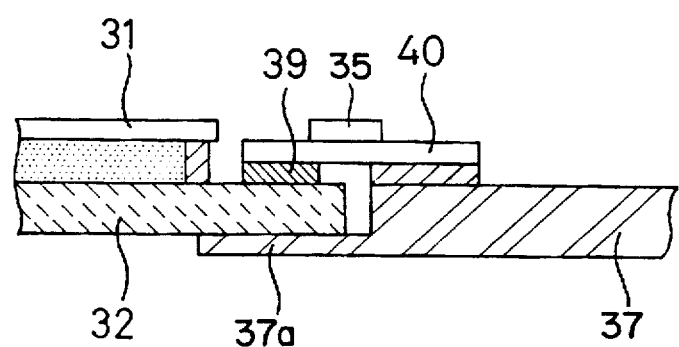
FIG. 3B is a partial cross-sectional side elevation view of one embodiment of the invention.

FIG. 3B is a partial cross-sectional side elevation view of one embodiment of the invention. In this view, a liquid crystal material fills a gap between the TFT glass 32 and the color filter glass 31, while its circumference is sealed by a sealing material. An anisotropic conductive film 39 is formed on the TFT glass 32. A source driver IC 35 is formed on the source PCB 37 composed of a plurality of layer, and an extension 37a of multi-layer having a step, is formed under the TFT glass 32. The source driver IC 35 and the tape carrier 4C are soldered, and the panel side of the above tape carrier is heated and compressed by an anisotropic conductive film 39 and connected electrically.

Such structure is very advantageous in that the increasing signal line is acceptable to the color filter glass 31 without occupying an area in the color filter glass 31, by which means the screen can be maintained in its size as it were, still permitting a high resolution and picture dot.

Figure 4:
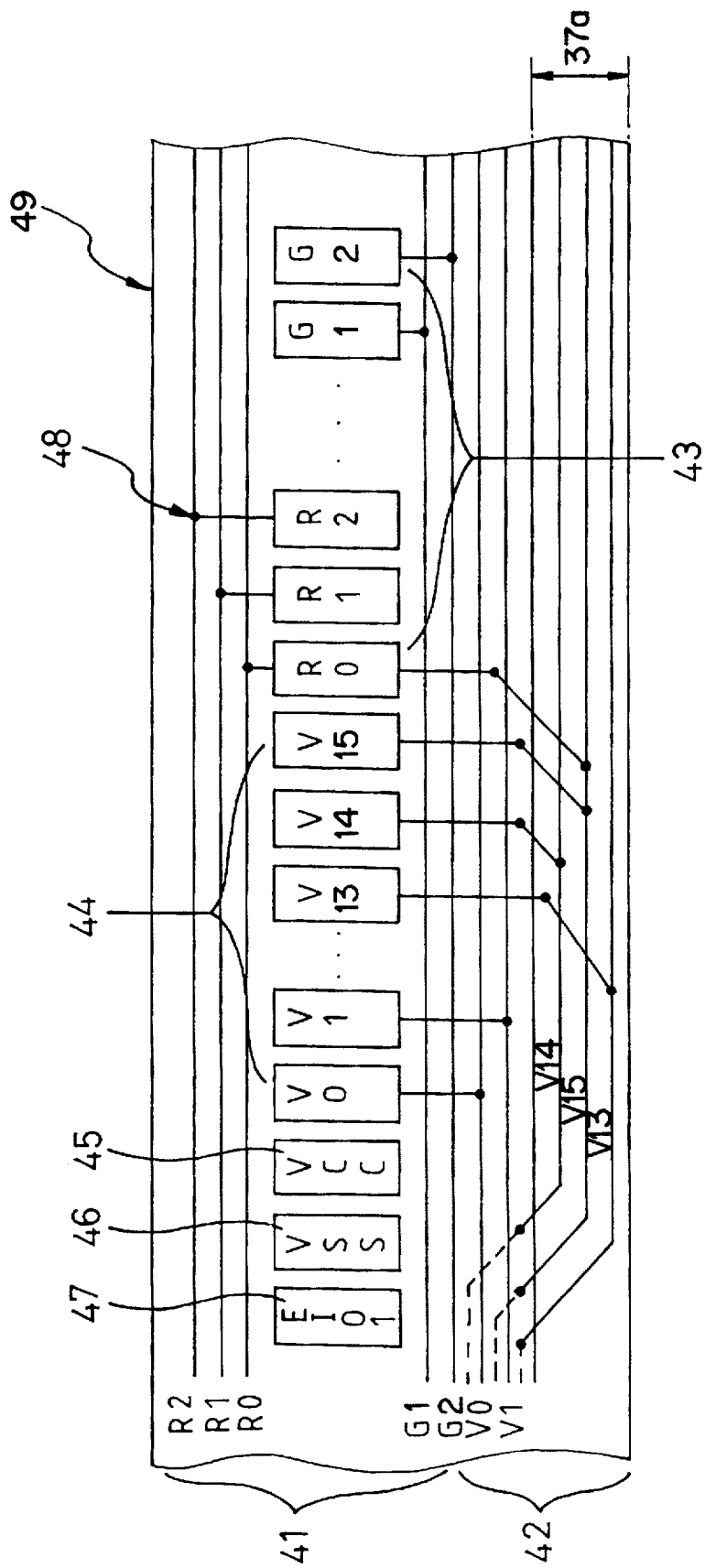
FIGS. 4 and 5 are wiring diagrams formed on a PCB of the invention.
Figure 5:
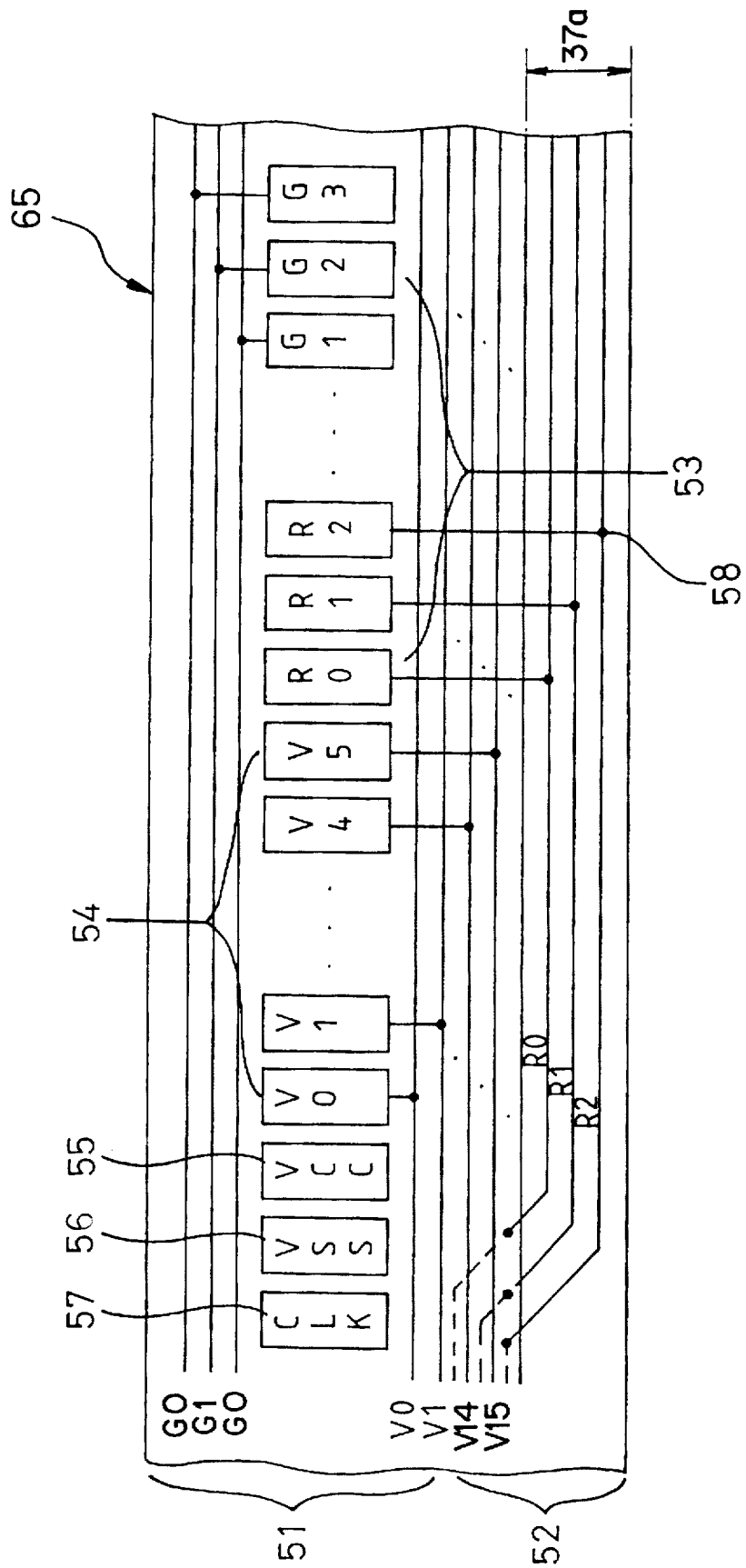

FIGS. 4 and 5 show, in further detail, wiring diagrams of the printed circuit board in this invention. In FIG. 4, the source PCB 49 structure includes a signal transmitting wire 41 which transmits color signals R,G,B from a gate PCB (not illustrated) to drive the LCD panel, a gradation voltage wire of which voltage is applied to the LCD module after being selected by color data, a color signal terminal 43 connected to the signal transmitting wire 41 in parallel, an analog terminal 44 connected to the gradation voltage wire 42 in parallel to adjust the amount of the light transmission, power terminal 45 to supply the power to each element, a ground terminal 46 to protect the LCD module from the over voltage, and an input signal terminal 47 to transmit each control signal.

In this structure, some of the entire wires are arranged in the extension 37a of the source PCB 49 to obtain a high density structure. At this time, such wires can be arranged forming the plural layers on the extension 37a. The signal lines of the driver circuit IC 35 are electrically connected to those of the adjacent driver circuit IC contact hole 48 by using the increased wiring area.

In FIG. 5, the source PCB 65 structure includes a signal transmitting wire 51 which transmits color signals R,G,B from the gate PCB (not illustrated) to drive the LCD panel, a gradation voltage wire 52 of which voltage selected by the color data is applied to the LCD module, a color signal terminal 53 which is connected to the signal transmitting wire 51 in parallel, an analog signal terminal 54 which is connected to the gradation voltage wire 52 in parallel to adjust the amount of light transmission, a power terminal 55 which supplies power source to each element, a ground terminal 56 which protects the LCD module from an over voltage, and signal inputting terminals 57 and CLK. In this structure, each terminal of the multi-layer source PCB 65 is electrically connected to the adjacent circuits via hole 58. Further, in order to increase the density of the circuit, the partial circuits are arrayed in the extension 37a separately.

The partial color signals R1, R2, R3 are arrayed on the source PCB 65, respectively, and connected to each layer by each via hole. At this time, the entire color signal wiring can be arrayed on the extension 37a in one layer or multiple layers. The signal lines of the driver IC 35 are electrically connected to those of the adjacent driver IC in the increased wiring area by a contact hole 58. As mentioned above, it is possible to separately array the partial or entire color signal and the partial or entire gradation voltage wiring on the source PCB.

In summary, in FIGS. 3 to 5, a plurality of the source driver IC 35 of the source PCB are electrically connected to the control circuit of the gate PCB 34. The color data R,G,B processed in the control circuit of the gate PCB 14, the gradation voltage selected by each color data and applied to the LCD module, as well as the control signals from the signal inputting terminal is for controlling the source driver IC 17, are outputted from the input terminal, transmitted to each source driver IC 35 according to the horizontal control signal, and then outputted to the TFT glass as the vertical data line once decoded into the gradation voltage.

Such liquid crystal display module described in this invention can be modified according to the number and type of the wire, as well as the design specification of the semiconductor device to be used. Therefore, this invention is not limited to the embodiments described here and can be modified within the scope of the invention.

What is claimed is:

1. A liquid crystal display (LCD) module comprising:

an LCD panel;

a driver integrated circuit for driving the LCD panel; and a printed circuit board for mounting the driver integrated circuit thereon, said printed circuit board having a stepped extension on one side of said printed circuit board, said extension extending to an inert area of said LCD panel and containing a plurality of wires of said driver integrated circuit.

2. A liquid crystal display module according to claim 1, wherein said extension is composed of at least one layer.

3. A liquid crystal display module according to claim 1, wherein said extension having steps is piled on the lower side of said LCD panel.

* * * * *